United States Patent
Bertolini

[19]

[11] Patent Number: 6,111,429
[45] Date of Patent: Aug. 29, 2000

[54] CIRCUIT FOR SHIFTING THE VOLTAGE LEVEL OF A DIGITAL SIGNAL

[75] Inventor: Luca Bertolini, Milan, Italy

[73] Assignee: SGS-Thomson Microelectronics, S.r.l., Agrate Brianza, Italy

[21] Appl. No.: 09/079,131

[22] Filed: May 14, 1998

[30] Foreign Application Priority Data

May 15, 1997 [IT] Italy .................................. MI97A1142

[51] Int. Cl.$^7$ .............................................. H03K 19/0175
[52] U.S. Cl. ................................................ 326/68; 326/81
[58] Field of Search ................................... 326/68, 80, 81, 326/83, 86, 112, 119, 121, 115

[56] References Cited

U.S. PATENT DOCUMENTS

| 5,378,932 | 1/1995 | Shin et al. | 327/333 |
| 5,818,257 | 10/1998 | Villa | 326/81 |
| 5,872,476 | 2/1999 | Mihara et al. | 327/333 |

*Primary Examiner*—Michael Tokar
*Assistant Examiner*—Anh Tran
*Attorney, Agent, or Firm*—Jenkens & Gilchrist, P.C.; Theodore E. Galanthay

[57] ABSTRACT

A circuit for shifting the voltage level of a digital signal, comprising a first pair of transistors of a first polarity, which are connected to a high-voltage line, and a second pair of transistors of a second polarity, which are connected to a ground line; the first and second pairs of transistors are connected to each other by means of the drain terminals of the respective transistors; an input voltage is applied to the gate terminals of the first pair of transistors. The circuit further includes a secondary circuit for leveling the gate voltages of the transistors of the first and second pairs, which is connected between the first and second pairs of transistors and whereto at least one reference voltage is applied. The circuit also includes an output stage, whose output is a voltage which is shifted in level with respect to the input voltage. The secondary circuit limits the gate-source voltage value of the first pair of transistors to a value which is independent of the voltage value of the high-voltage line, so as to prevent damage to the first pair of transistors.

13 Claims, 1 Drawing Sheet

CIRCUIT FOR SHIFTING THE VOLTAGE LEVEL OF A DIGITAL SIGNAL

FIELD OF THE INVENTION

The present invention relates to a circuit for shifting the voltage level of a digital signal and, more particularly, to a circuit which is capable of shifting a voltage value of a digital signal from a ground voltage value to a high voltage value.

BACKGROUND OF THE INVENTION

It is known that it is often desirable to shift the voltage value of a digital signal to a high voltage value, maintaining the same phase. Circuit solutions which perform this task are known for this purpose.

Conventional circuits are generally capable of effectively providing the intended shift, obtaining a circuit output voltage which closely follows the input voltage, i.e., has very short rise and delay times over a wide input voltage range. Moreover, conventional circuits are implemented so as to minimize the consumption of silicon area, in the case of monolithic implementations, or the number of components, in the case of discrete implementations.

Another characteristic of a shift circuit is that current flows through the circuit, and therefore, power is absorbed. It is better to have a flow of current only during level transition steps.

Conventional circuits thus meet these requirements but entail a drawback which limits their use to certain voltage ranges.

This drawback is shown with reference to the circuit of FIG. 1, illustrating a conventional circuit solution for a level shift circuit. The circuit of FIG. 1 comprises two P-channel MOS transistors 1 and 2 which are connected to a high voltage branch, designated by Vh, by means of their respective source terminals, and to the drain terminals of a second pair of N-channel MOS transistors 3 and 4 by means of their drain terminals. The source terminals of the second pair of transistors are connected to a ground voltage branch. An input voltage Vin and its complementary voltage, inverted by means of an inverter 5, are respectively applied to the gate terminals of the transistors 3 and 4.

The gate terminals of the P-channel MOS transistors 1 and 2 are respectively connected to the branches for connection between the drain terminals of the transistors 2 and 4 and between the drain terminals of the transistors 1 and 3. The output of the circuit is of the differential type and is designated by Vu1 and Vu2.

The above circuit, although meeting the above requirements, is affected by the drawback that if the high voltage branch Vh is placed at a voltage level higher than the maximum operating voltage of the gate oxide of the MOS transistors 1 and 2, said transistors can break down.

This problem worsens as the progress of technology leads to use of transistors with increasingly thinner gate oxide. The continuing reduction in oxide thickness on the one hand entails a parallel reduction of the threshold voltage Vt of the transistors and an increase in the intrinsic breakdown of the drain and source terminals, but on the other hand, determines a lower maximum operating gate-source voltage (Vgs). Accordingly, transistors produced with modem technologies are not capable of withstanding high voltages and are in any case limited by the value of their gate-source voltage.

SUMMARY OF THE INVENTION

Therefore, one object of the present invention is to provide a circuit for shifting the voltage level of a digital signal to obtain an output signal having a full dynamic range, i.e., an output signal wherein level shifting can be performed without damaging the transistors connected to the high-voltage side.

Another object of the present invention is to provide a circuit for shifting the voltage level of a digital signal, wherein the high voltage level is independent of the maximum operating gate voltage of the transistors connected to the high-voltage side.

Another object of the present invention is to provide a circuit for shifting the voltage level of a digital signal which is efficient from the point of view of silicon area occupation or, in the case of a discrete implementation, in terms of the number of circuit components.

Another object of the present invention is to provide a circuit for shifting the voltage level of a digital signal wherein current flow occurs only during transitions.

Another object of the present invention is to provide a circuit which is highly reliable, relatively easy to manufacture and at competitive costs.

Accordingly, the present invention provides a circuit for shifting the voltage level of a digital signal comprising a first pair of transistors of a first polarity, which are connected to a high-voltage line, and a second pair of transistors of a second polarity, which are connected to a ground line. The first and second pairs of transistors are connected to each other by means of the drain terminals of the respective transistors wherein an input voltage is applied to the gate terminals of the first pair of transistors. A secondary circuit is included for leveling the gate voltages of the transistors of the first and second pairs of transistors and is connected between the first and second pairs of transistors and whereto at least one reference voltage is applied. An output stage is also included whose output is a voltage which is shifted in level with respect to the input voltage. The secondary circuit limits the gate-source voltage value of the first pair of transistors to a value which independent of the voltage value of the high-voltage line, so as to prevent damage to the first pair of transistors.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

Further characteristics and advantages of the circuit according to the present invention will become apparent from the following detailed description of a preferred but not exclusive embodiment thereof, illustrated only by way of non-limitative example in the accompanying drawings, wherein.

DETAILED DESCRIPTION OF A PREFERRED EMBODIMENT OF THE INVENTION

Figure 1:
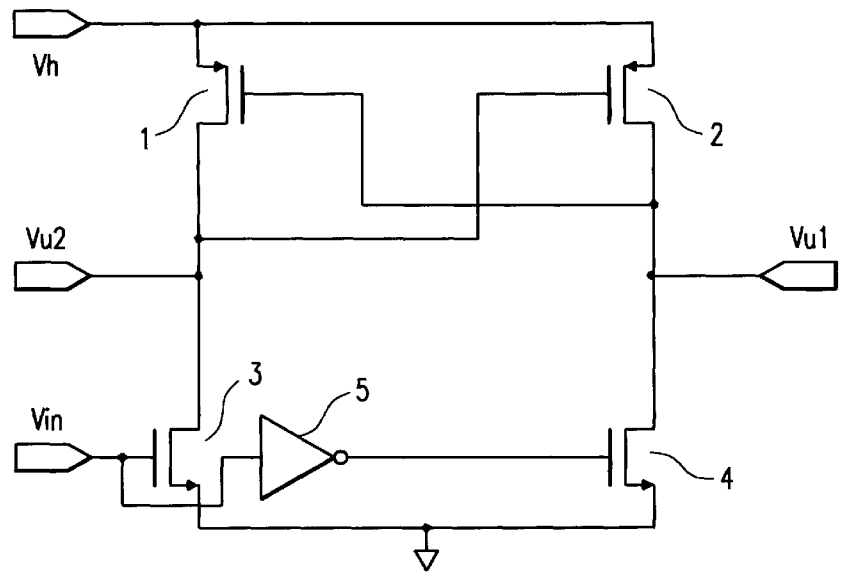
FIG. 1 is a circuit diagram of a conventional prior art level shifting circuit.

It should be noted that identical reference numerals designate identical elements in all the figures.

FIG. 1 has already been presented and is therefore not discussed further hereinafter.

Figure 2:
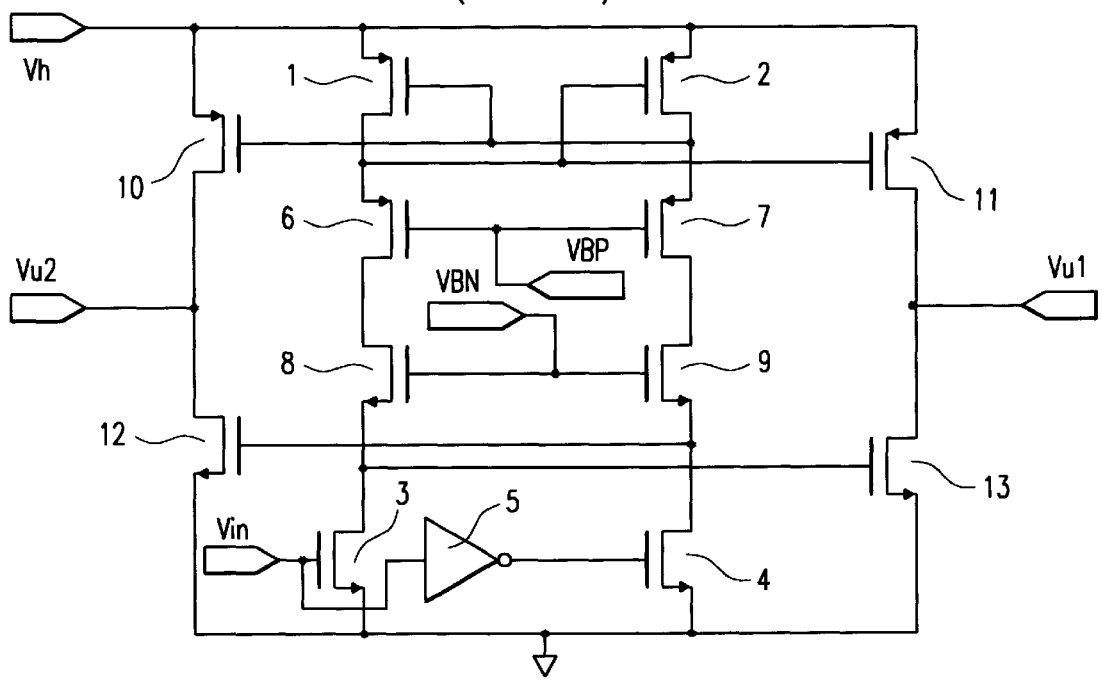
FIG. 2 is a circuit diagram of a level shifting circuit according to the present invention.

Thus, with reference to FIGS. 2 and 3, the circuit according to the present invention comprises a circuit portion which is similar to the portion shown in FIG. 1 and comprises a first pair of P-channel MOS transistors 1 and 2 which are connected, by means of their respective source terminals, to a high-voltage branch, designated by Vh, and by means of their drain terminals to the drain terminals of a second pair of N-channel MOS transistors 3 and 4, whose source terminals are connected to a ground voltage branch.

The pairs of N-channel and P-channel MOS transistors constitute transistors for driving the gate voltages of the output stage (which will be described hereinafter).

In addition to this circuit portion, which is known, the circuit according to the invention (see FIG. 2) is provided with a secondary circuit for leveling the gate voltage of the driving transistors 1, 2, 3 and 4, which is constituted by a third pair of P-channel MOS transistors 6 and 7 and by a fourth pair of N-channel MOS transistors 8 and 9.

An output stage, constituted by the P-channel MOS transistors 10 and 11 (fifth pair of transistors) and by the N-channel MOS transistors 12 and 13 (sixth pair of transistors), completes the circuit according to the present invention.

In detail, leveling transistors 6, 7 and 8, 9 are interposed between the transistors 1, 2 and the transistors 3 and 4. In particular, the source terminals of the MOS transistors 6 and 7 are connected respectively to the drain terminals of the transistors 1 and 2, and the source terminals of the MOS transistors 8 and 9 are respectively connected to the drain terminals of the MOS transistors 3 and 4.

The gate terminals of the transistors 6 and 7 and 8 and 9 are respectively common-connected, and a reference voltage (VBP for the transistors 6 and 7, VBN for the transistors 8 and 9) is applied thereto. Their source terminals are common-connected.

For the transistors 10, 11 and 12, 13 that constitute the output stage, the source terminals are connected to the high-voltage line Vh (the source terminals of the transistors 10 and 11) and to the ground line (the source terminals of the transistors 12 and 13).

The gate terminals of the transistors 10 and 11 are respectively connected to the drain-source terminals of the MOS transistors 2, 7 and 1, 6. Likewise, the gate terminals of the transistors 12 and 13 are respectively connected to the source-drain terminals of the MOS transistors 9, 4 and 8, 3. The gate terminals of the P-channel MOS transistors 1 and 2 are respectively connected to the gate terminals of the MOS transistors 10 and 11.

The output of the circuit is of the differential type and is designated by Vu1 and Vu2, respectively, at the branch for mutually connecting the drain terminals of the MOS transistors 11, 13 and 10, 12.

With reference to the above figures, operation of the circuit according to the present invention is as follows. The MOS transistors 1, 6, 8 and 3 constitute a first left branch of the circuit, while the MOS transistors 2, 7, 9 and 4 constitute a second right branch thereof. Assume that the circuit is in a steady state with an input voltage Vin equal to zero.

When a positive input voltage signal Vdd is applied to the gate terminals of the MOS transistors 3 and 4 as the input Vin, the transistor 3 switches on, while the inverter 5 switches off the transistor 4.

The current flows in the left branch of the circuit as long as the transistor 3 is on. The voltage at the gate terminal of the transistor 2 reaches the voltage value Vh of the high-voltage line, while the voltage at the gate terminal of the transistor 1 decreases until it reaches a value which is equal to the reference voltage VBP plus the threshold Vt6 of the transistor 6. In this manner, the voltage at the gate terminal of the transistor 2 is brought to the value Vh. In practice, the transistors 11, 2 are switched on, while the transistors 10 and 1 are switched off. The direct current in the left and right branches is nil, and a second steady state of the circuit is reached.

The secondary leveling circuit composed of the transistors 6, 7, 8, 9 is fully active with zero direct current.

The transistor 13 is switched on with a gate-source voltage, Vgs, equal to VBN-Vt8, where Vt8 is the threshold voltage of the transistor 8. The transistor 12 is instead off. In this condition, the open-circuit output voltages Vu1 and Vu2 are set to the value Vh of the high-voltage line and to the ground, respectively. All the gate-source voltages are thus set to limited values which are determined by the reference voltages VBP and VBN.

When the input voltage Vin is connected to the ground, the switching process is repeated as above, except that the left and right branches are swapped: in this second case also, no direct current flows in the two branches.

The following table summarizes the conditions assumed by the transistors composing the circuit according to the invention in the two above-mentioned steady states.

| | First steady state | | Second steady state | |
|---|---|---|---|---|
| trans. | Vgs | Vds | Vgs | Vds |
| 2 | 0 | Vh-VBP + Vt7 | Vj − VBP + V+ 6 | 0 |
| 1 | Vh − VBP + Vt7 | 0 | 0 | Vh − VBP + Vt6 |
| 7 | Vt7 | 0 | Vh − VBP | 0 |
| 6 | Vh − VBP | VBP + Vt6 | Vt6 | VBP + Vt7 |
| 4 | Vdd | 0 | 0 | VBN − Vt9 |
| 3 | 0 | VBN − Vt8 | Vdd | 0 |
| 9 | VBN | 0 | Vt9 | Vh − VBN − Vt9 |
| 8 | Vt8 | Vh − VBN − Vt8 | VBN | 0 | where Vt6, Vt7, Vt8 and Vt9 are, respectively, the threshold voltages of the MOS transistors 6, 7, 8 and 9.

The peak current during switching from one state to the other is mainly determined by the type of transistor in the branch and by the value of VBP and VBN. The relative size of the transistors 1, 2, 3 and 4 must be chosen so as to allow switching with the lowest possible Vdd and so as to minimize the current through the output stage during switching. The reference voltages VBP, VBN are chosen so as to cope with the limitations of the maximum gate-source voltage Vgs for the transistors 1, 2, 10, 11, 12 and 13.

Figure 3A:
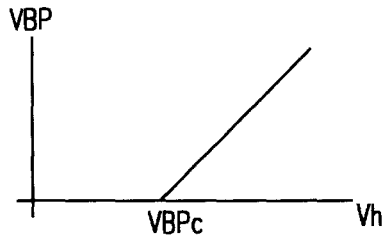
FIGS. 3a and 3b show two charts plotting the waveforms of the reference voltages in the circuit according to the present invention.
Figure 3B:
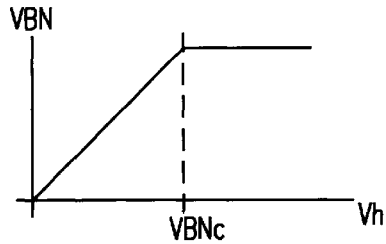

To allow the circuit according to the invention to have not only a full dynamic range but also to operate with the lowest possible value of Vh, FIGS. 3a and 3b respectively plot the charts of the characteristics of the reference voltages VBP and VBN as a function of the voltage Vh.

By examining FIGS. 3a and 3b, it can be noted that if the following inequalities hold:

Vh<VBPc

Vh>VBNc

Then the reference voltage VBP should be as close as possible to, or lower than, the ground voltage, while the reference voltage VBN should be as close as possible to the supply voltage of the high-voltage line, so as to force the pairs of leveling transistors 6, 8 and 7, 9 to behave like a low-resistance path for the driving stages of the gate voltage 1, 2, 3 and 4.

If the above conditions are met, the minimum voltage Vh with which the circuit according to the present invention is operational is given by the sum of the threshold voltages Vt of the transistors 1, 7 (transistors 2, 6), which is normally higher than the threshold of the transistors 8, 13 (transistors 9, 12).

In practice, it has been observed that the circuit according to the invention fully achieves the intended aim and objects, since it allows to obtain, in addition to requirements that had already been met by conventional circuits, a full dynamic range for the output voltage, eliminating the dependency of the gate-source voltage of the transistors that drive the gate voltages on the voltage Vh on the high-voltage supply line.

In this manner, switching between one state (voltage level) and another state (another voltage level) of the voltage value of a digital signal can occur without damaging the components of the voltage level shifting circuit, i.e., limiting breakdowns if the maximum voltage Vgs between the gate and the source of the P-channel transistors is lower than the voltage Vh of the high-voltage line.

The circuit thus conceived is susceptible of numerous modifications and variations, all of which are within the scope of the inventive concept; all the details may also be replaced with other technically equivalent elements.

Thus, for example, the PMOS and NMOS transistors described above can be provided by means of any technology, provided that the above set conditions are met.

In practice, the materials employed, so long as they are compatible with the specific use, as well as the dimensions, may be any according to requirements and to the state of the art.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A circuit for shifting the voltage level of a digital signal, comprising:

first pair of transistors of a first polarity connected to a high-voltage line;

a second pair of transistors of a second polarity connected to a ground line, said first and said second pairs of transistors being connected to each other by the drain terminals of the respective transistors, an input voltage being applied to the gate terminal of a first one of said second pair of transistors;

a secondary circuit for leveling the gate voltages of the transistors of said first and said second pairs of transistors, said secondary circuit is connected between the drain terminals of said first and said second pairs of transistors and limits the gate-source voltage value of said first pair of transistors to a value which is independent of the voltage value of said high-voltage line so as to prevent damage to said first pair of transistors, two reference voltages are applied to said secondary circuit; and an output stage, whose output is a voltage which is shifted in level with respect to said input voltage, wherein said output stage is a complementary output stage comprising a third pair of transistors and a fourth pair of transistors that are of said first and second polarities, respectively, and connected to said high-voltage line and to said around line, respectively, said output stage not being directly connected to either of said two reference voltages.

2. The circuit according to claim 1, wherein said secondary circuit comprises a fifth pair of transistors and a sixth pair of transistors of said first and second polarities, respectively, which are connected to each other and are interposed between said first and second pairs of transistors.

3. The circuit according to claim 2, wherein a first of said two reference voltages is applied to the gate terminals of said fifth pair of transistors, the source terminals of said fifth pair of transistors being connected respectively to drain terminals of transistors of said first pair of transistors, the drain terminals of said fifth pair of transistors being connected to the drain terminals of said sixth pair of transistors.

4. The circuit according to claim 2, wherein a second of said two reference voltages is applied to the gate terminals of said sixth pair of transistors.

5. The circuit according to claim 4, wherein said two reference voltages are chosen so as to meet the restrictions regarding the gate-source voltage of the transistors of said first pair of transistors and of said third and fourth pairs of transistors.

6. The circuit according to claim 5, wherein said first of said two reference voltages has a value which is close to said ground voltage and said second of said two reference voltages has a value which is close to the voltage value of said high-voltage line.

7. The circuit according to claim 2, wherein the source terminals of said sixth pair of transistors are connected to the drain terminals of said second pair of transistors and drain terminals of the sixth pair of transistors are connected to the drain terminals of said fifth pair of transistors.

8. The circuit according to claim 2, wherein the transistors of said fifth and sixth pairs of transistors are MOS transistors with P and N polarity, respectively.

9. The circuit according to claim 1, wherein said third and fourth pairs of transistors have interconnected drain terminals, the gate terminals of said third pair of transistors being connected to the drain-source terminals of said first and fifth pairs of transistors, and the gate terminals of said fourth pair of transistors being connected to the drain-source terminals of said second and sixth pairs of transistors.

10. The circuit according to claim 1, wherein the transistors of said third and fourth pairs of transistors are MOS transistors with P and N polarity, respectively.

11. The circuit according to claim 1, wherein said input voltage is fed in its complementary form, after passing through an inverter, to the gate terminal of a second one of the transistors of said second pair of transistors.

12. The circuit according to claim 1, wherein the output of said output stage is complementary, said output being tapped at the drain terminals of the transistors of said third and fourth pairs of transistors.

13. The circuit according to claim 1, wherein the transistors of said first and second pairs of transistors are MOS transistors with P and N polarity, respectively.

* * * * *